US012690278B2

(12) United States Patent
Jin et al.

(10) Patent No.: US 12,690,278 B2
(45) Date of Patent: Jul. 21, 2026

(54) METAL OXYNITRIDE BACK CONTACT LAYERS FOR PHOTOVOLTAIC DEVICES

(71) Applicant: First Solar, Inc., Tempe, AZ (US)

(72) Inventors: Changming Jin, Sylvania, OH (US); Vijay Karthik Sankar, Dearborn, MI (US)

(73) Assignee: First Solar, Inc., Phoenix, AZ (US)

( * ) Notice: Subject to any disclaimer, the term of this patent is extended or adjusted under 35 U.S.C. 154(b) by 272 days.

(21) Appl. No.: 17/428,725

(22) PCT Filed: Feb. 6, 2020

(86) PCT No.: PCT/US2020/016944
§ 371 (c)(1),
(2) Date: Aug. 5, 2021

(87) PCT Pub. No.: WO2020/163562
PCT Pub. Date: Aug. 13, 2020

(65) Prior Publication Data
US 2022/0102567 A1    Mar. 31, 2022

Related U.S. Application Data

(60) Provisional application No. 62/801,965, filed on Feb. 6, 2019.

(51) Int. Cl.
*H10F 19/90*     (2025.01)
*H10F 10/162*    (2025.01)
(52) U.S. Cl.
CPC ......... *H10F 19/908* (2025.01); *H10F 10/162* (2025.01); *H10F 19/906* (2025.01)

(58) Field of Classification Search
None
See application file for complete search history.

(56) References Cited

U.S. PATENT DOCUMENTS

| | | |
|---|---|---|
| 7,923,354 B2 | 4/2011 | Choi et al. |
| 8,409,455 B1 | 4/2013 | Oetting |
| 9,105,799 B2 | 8/2015 | Cheng et al. |
| 9,147,778 B2 | 9/2015 | Zafar et al. |
| 9,178,097 B2 | 11/2015 | Liang et al. |
| 9,412,886 B2 | 8/2016 | Addepalli et al. |
| 9,459,386 B2 | 10/2016 | Hebrink et al. |
| 9,461,186 B2 | 10/2016 | Jayaraman et al. |
| 9,508,874 B2 | 11/2016 | Buller et al. |
| 9,871,154 B2 | 1/2018 | Duggal et al. |

(Continued)

FOREIGN PATENT DOCUMENTS

| | | |
|---|---|---|
| EP | 2800144 A1 | 11/2014 |
| JP | 2009542008 A | 11/2009 |

(Continued)

OTHER PUBLICATIONS

Examination report, dated Apr. 10, 2023, Indian Patent Application 202117034554.

(Continued)

*Primary Examiner* — Daniel P Malley, Jr.
(74) *Attorney, Agent, or Firm* — MacMillan, Sobanski & Todd, LLC

(57)            ABSTRACT
According to the embodiments provided herein, back contacts for photovoltaic devices can include one or more metal oxynitride layers.

6 Claims, 8 Drawing Sheets

(56)                   References Cited

U.S. PATENT DOCUMENTS

| | | | |
|---|---|---|---|
| 10,026,861 | B2 | 7/2018 | Sankin et al. |
| 10,141,463 | B2 | 11/2018 | Korevaar et al. |
| 10,243,092 | B2 | 3/2019 | Damjanovic et al. |
| 10,529,883 | B2 | 1/2020 | Damjanovic et al. |
| 10,861,994 | B2 | 12/2020 | Abken et al. |
| 10,896,991 | B2 | 1/2021 | Jin et al. |
| 11,164,989 | B2 | 11/2021 | Andreini et al. |
| 11,450,778 | B2 | 9/2022 | Ring et al. |
| 11,695,085 | B2 | 7/2023 | Jayamaha et al. |
| 11,784,278 | B2 | 10/2023 | Andreini et al. |
| 11,876,140 | B2 | 1/2024 | Blaydes et al. |
| 2004/0063320 | A1 | 4/2004 | Hollars |
| 2004/0144419 | A1 | 7/2004 | Fix et al. |
| 2008/0280030 | A1 | 11/2008 | Van Duren et al. |
| 2009/0020150 | A1 | 1/2009 | Atwater et al. |
| 2011/0146784 | A1 | 6/2011 | Addepalli et al. |
| 2011/0151173 | A1 | 6/2011 | Ramadas et al. |
| 2011/0247687 | A1 | 10/2011 | Zhang et al. |
| 2012/0156828 | A1 | 6/2012 | Peng et al. |
| 2012/0164434 | A1 | 6/2012 | Ramadas et al. |
| 2012/0258294 | A1 | 10/2012 | Leyder et al. |
| 2014/0060608 | A1* | 3/2014 | Choi ................. H01L 31/03925 |
| | | | 438/57 |
| 2014/0261667 | A1 | 9/2014 | Buller et al. |
| 2014/0284750 | A1 | 9/2014 | Yu et al. |
| 2014/0338741 | A1* | 11/2014 | Palm ................... H01L 31/1864 |
| | | | 438/95 |
| 2015/0380601 | A1 | 12/2015 | Zafar et al. |
| 2016/0380123 | A1* | 12/2016 | Woods ............ H01L 31/022425 |
| | | | 136/256 |
| 2017/0170353 | A1* | 6/2017 | Jin ........................ H10F 10/162 |
| 2019/0148571 | A1 | 5/2019 | Jayamaha et al. |
| 2019/0198256 | A1 | 6/2019 | Hayakawa et al. |
| 2019/0296174 | A1 | 9/2019 | Gloeckler et al. |
| 2020/0066928 | A1 | 2/2020 | Buller et al. |
| 2021/0288204 | A1* | 9/2021 | Eaglesham ......... H10F 77/1233 |
| 2021/0376177 | A1 | 12/2021 | Chen et al. |

FOREIGN PATENT DOCUMENTS

| | | | |
|---|---|---|---|
| JP | 2010533985 | A1 | 10/2010 |
| JP | 2011515852 | A | 5/2011 |
| JP | 2016517182 | A | 6/2016 |
| JP | 2016517183 | A | 6/2016 |
| WO | 2009117072 | A1 | 9/2009 |
| WO | 2013062825 | A1 | 5/2013 |
| WO | 2014177620 | A1 | 11/2014 |
| WO | 2014177621 | A1 | 11/2014 |
| WO | 2018056295 | A1 | 3/2018 |
| WO | 2018071509 | A1 | 4/2018 |
| WO | 2018157106 | A1 | 8/2018 |

OTHER PUBLICATIONS

PCT International Search Report and Written Opinion, dated May 27, 2020, Application No. PCT/US2020/016944.

Viswanathan, "Study of Cu Free Back Contacts to Thin Film CdTe Solar Cells," dissertation, Dept. of Electrical Engineering, University of South Florida, Feb. 2004.

Potamialis, "Copper Free Back Contacts for CdTe Solar Cells" dissertation, First Year Report, Loughborough University, Sep. 2015.

Japanese Notification of Reasons for Rejection, dated Dec. 21, 2021, Application No. 2021-546240.

Japanese Office Action, Application No. 2022-082736, dated Jan. 4, 2024.

Extended European Search Report, dated Aug. 9, 2024, application No. 24170320.6.

Drayton et al., "Molybdenum oxide and molybdenum oxide-nitride back contacts for CdTe solar cells," Journal of Vacuum Science, American Institute of Physics, (2015), vol. 33, No. 4, p. 041201-1-041201--7.

Feng et al., "Preparation and characterization of ZnTe as an interlayer for CdS/CdTe substrate thin film solar cells on flexible substrates," Thin Solid Films 535, (2013), pp. 202-205.

Guntur et al., "Molybdenum Nitride Films in the Back Contact Structure of Flexible Substrate CdTe Solar Cells," Thesis, College of Engineering, University of South Florida, (2011), 85 pages.

Kindvall et al., "Molybdenum Oxide and Molybdenum Nitride Back Contacts for Thin-Film CdTe Solar Cells," IEEE 44th Photovoltaic Specialist Conference, (2017), pp. 785-790.

Japanese Notification of Reason(s) for Rejection, Application No. 2022-082736, dated Aug. 30, 2024.

* cited by examiner

900

| Forming Absorber Stack | 901 |
| Treating Absorber Stack (optional) | 902 |
| Depositing First Layer 220 | 920 |
| Depositing Second Layer 230 | 930 |
| Depositing Layer 240 (optional) | 940 |
| Depositing Layer 260 (optional) | 960 |
| Depositing Layer 270 (optional) | 970 |
| Depositing Layer 210 | 910 |
| Depositing Layer 250 (optional) | 950 |
| Scribe & Deposit Conductive Layer(s) | 990 |

METAL OXYNITRIDE BACK CONTACT LAYERS FOR PHOTOVOLTAIC DEVICES

This application claims priority from U.S. Patent Application 62/801,965, filed Feb. 6, 2019, which is incorporated by reference herein.

BACKGROUND

The present specification generally relates to photovoltaic devices having one or more metallic back contact layers and, more specifically, photovoltaic having one or more metal oxynitride back contact layers.

A photovoltaic device generates electrical power by converting light into direct current electricity using semiconductor materials that exhibit the photovoltaic effect. Certain types of semiconductor material can be difficult to manufacture. For example, certain dopants provided in a layer of the back contact can diffuse through and throughout the back contact, which can lead to inoperability or instability of the photovoltaic device.

Accordingly, a need exists for alternative back contact layers for use with photovoltaic devices.

SUMMARY

The embodiments provided herein relate to photovoltaic devices having improved back contacts. These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of photovoltaic devices having metal nitride back contacts are provided herein. Various embodiments of the photovoltaic device, as well as, methods for forming the photovoltaic device will be described in more detail herein.

Figure 1:
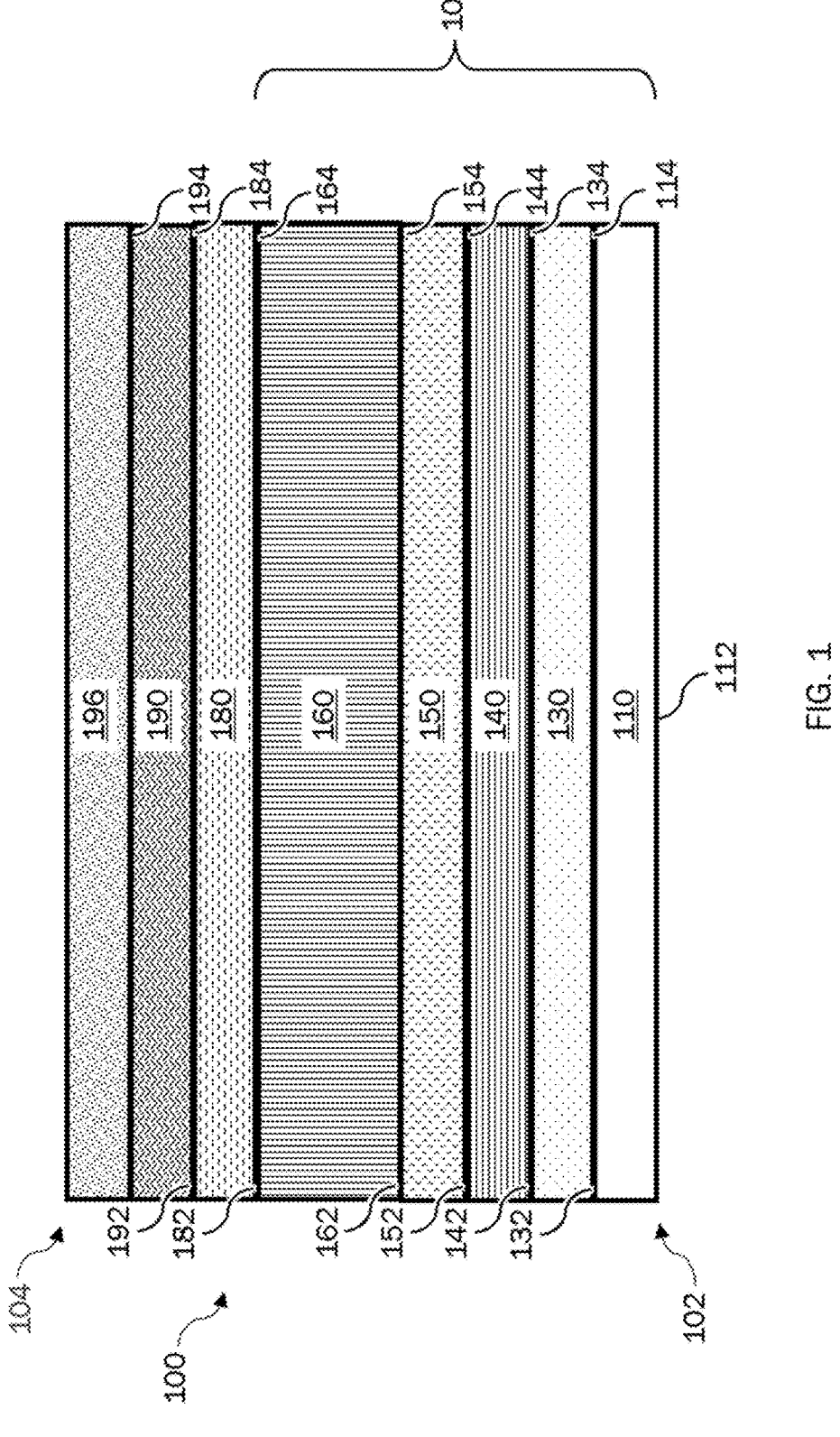
FIG. 1 schematically depicts a cross-sectional view of a photovoltaic device according to one or more embodiments shown and described herein.

Referring now to FIG. 1, an embodiment of a photovoltaic device 100 is schematically depicted. The photovoltaic device 100 can be configured to receive light and transform light into electrical signals, e.g., photons can be absorbed from the light and transformed into electrical signals via the photovoltaic effect. Accordingly, the photovoltaic device 100 can define an energy side 102 configured to be exposed to a light source such as, for example, the sun. The photovoltaic device 100 can also define an opposing side 104 offset from the energy side 102 such as, for example, by a plurality of material layers. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun. The photovoltaic device 100 can include a plurality of layers disposed between the energy side 102 and the opposing side 104. As used herein, the term "layer" refers to a thickness of material provided upon a surface. Each layer can cover all or any portion of the surface.

Figure 2:
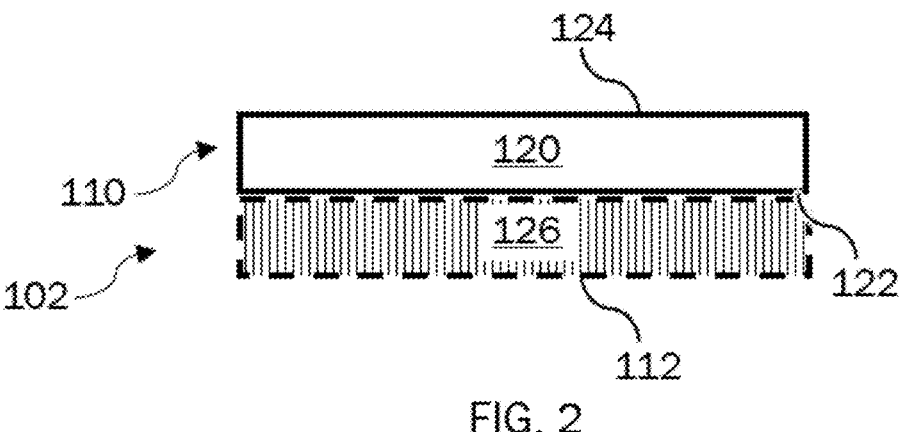
FIG. 2 schematically depicts a substrate according to one or more embodiments shown and described herein.

Referring collectively to FIGS. 1 and 2, the layers of the photovoltaic device 100 can include a substrate 110 configured to facilitate the transmission of light into the photovoltaic device 100. The substrate 110 can be disposed at the energy side 102 of the photovoltaic device 100. The substrate 110 can have a first surface 112 substantially facing the energy side 102 of the photovoltaic device 100 and a second surface 114 substantially facing the opposing side 104 of the photovoltaic device 100. One or more layers of material can be disposed between the first surface 112 and the second surface 114 of the substrate 110.

The substrate 110 can include a transparent layer 120 having a first surface 122 substantially facing the energy side 102 of the photovoltaic device 100 and a second surface 124 substantially facing the opposing side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance, including about 250 nm to about 1,300 nm in some embodiments, or about 250 nm to about 950 nm in other embodiments. The transparent layer 120 may also have any suitable transmission percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 1, the photovoltaic device 100 can include a barrier layer 130 configured to mitigate diffusion of contaminants (e.g. sodium) from the substrate 110, which could result in degradation or delamination. The barrier layer 130 can have a first surface 132 substantially facing the energy side 102 of the photovoltaic device 100 and a second surface 134 substantially facing the opposing side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 1, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the energy side 102 of the photovoltaic device 100 and a second surface 144 substantially facing the opposing side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin oxide, fluorine doped tin oxide (e.g., F:SnO, F:SnO$_2$, or F:SnO$_x$), indium tin oxide, or cadmium stannate.

The photovoltaic device 100 can include a buffer layer 150 configured to provide an insulating layer between the TCO layer 140 and any adjacent semiconductor layers. The buffer layer 150 can have a first surface 152 substantially facing the energy side 102 of the photovoltaic device 100 and a second surface 154 substantially facing the opposing side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 140 may include material having higher resistivity than the TCO later 140, including, but not limited to, intrinsic tin oxide (SnO, SnO$_2$, or SnO$_x$), magnesium oxide (MgO), zinc magnesium oxide (e.g., Zn$_{1-x}$Mg$_x$O), silicon dioxide (SiO$_2$), manganese oxide (MnO$_x$), silicon nitride (SiN$_x$), or any combination thereof.

The photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical power. The absorber layer 160 can have a first surface 162 substantially facing the energy side 102 of the photovoltaic device 100 and a second surface 164 substantially facing the opposing side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors. Specific examples include, but are not limited to, semiconductor materials comprising cadmium, tellurium, selenium, or any combination thereof. Suitable examples include, but are not limited to, ternaries of cadmium, selenium and tellurium (e.g., CdSe$_x$Te$_{1-x}$), or a compound comprising cadmium, selenium, tellurium, and one or more additional element.

In embodiments where the absorber layer 160 comprises tellurium and cadmium, the atomic percent of the tellurium can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, the atomic percent of the tellurium in the absorber layer 160 can be greater than about 45 atomic percent such as, for example, greater than about 49% in one embodiment. It is noted that the atomic percent described herein is representative of the entirety of the absorber layer 160, the atomic percentage of material at a particular location within the absorber layer 160 can vary with thickness compared to the overall composition of the absorber layer 160.

In embodiments where the absorber layer 160 comprises selenium and tellurium, the atomic percent of the selenium in the absorber layer 160 can be greater than about 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can vary through the thickness of the absorber layer 160. For example, when the absorber layer 160 comprises a compound including selenium at a mole fraction of x and tellurium at a mole fraction of 1-x (Se$_x$Te$_{1-x}$), x can vary in the absorber layer 160 with distance from the first surface 162 of the absorber layer 160.

Referring still to FIG. 1, the absorber layer 160 can be doped with a dopant configured to manipulate the charge carrier concentration. In some embodiments, the absorber layer 160 can be doped with a dopant such as, for example, one or more group I dopants, one or more group V dopants, or a combination thereof. The total density of the dopant within the absorber layer 160 can be controlled. Alternatively or additionally, the amount of the dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

Figure 3:
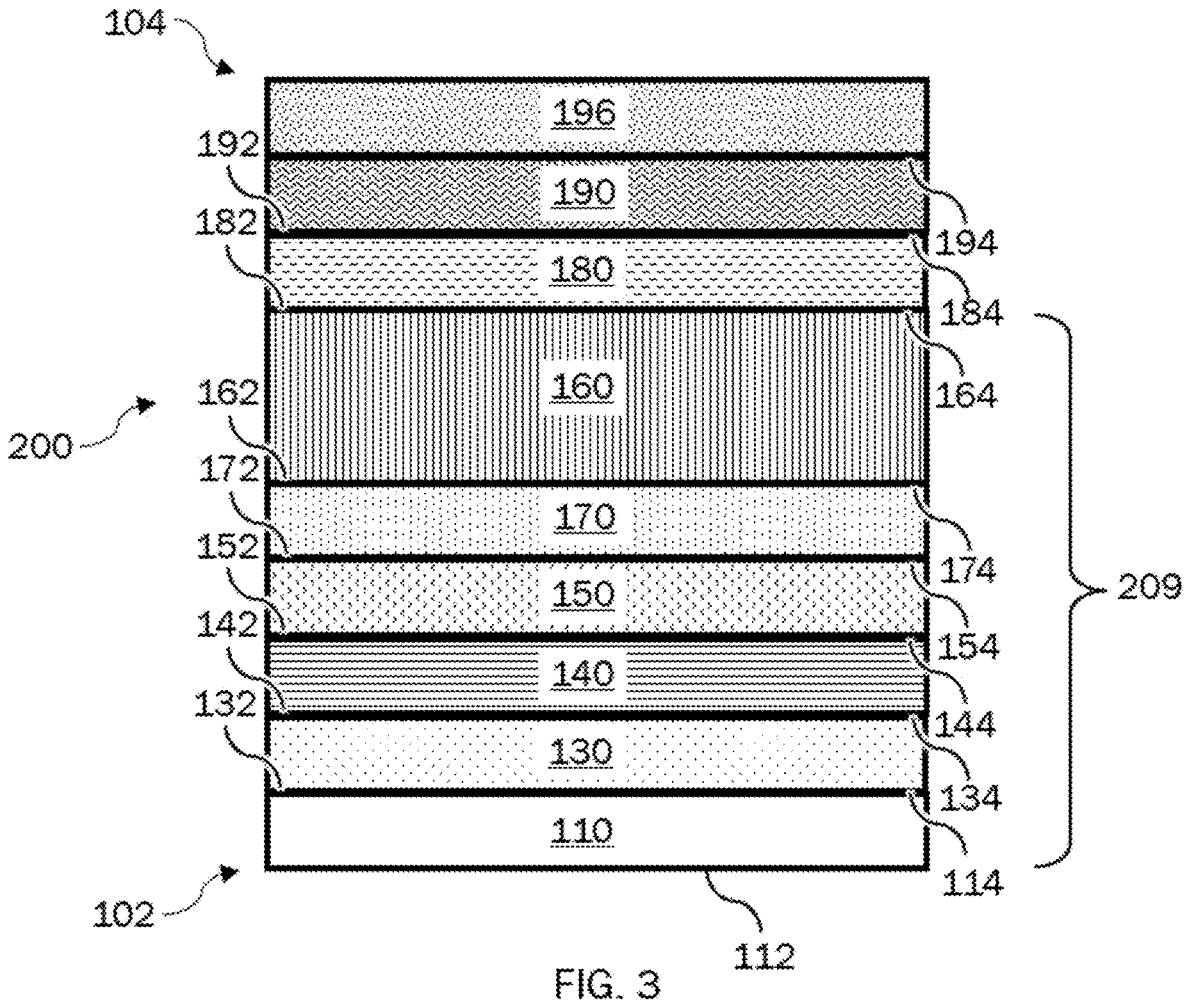
FIG. 3 schematically depicts a cross-sectional view of a photovoltaic device according to one or more embodiments shown and described herein.

Referring now to FIG. 3, in some embodiments, a photovoltaic device 200 can include a window layer 170 comprising n-type semiconductor material. Aside from the window layer 170, the photovoltaic device 200 can have a substantially similar layer structure as the photovoltaic device 100 (FIG. 1). The absorber layer 160 can be formed adjacent to the window layer 170. The window layer 170 can have a first surface 172 substantially facing the energy side 102 of the photovoltaic device 200 and a second surface 174 substantially facing the opposing side 104 of the photovoltaic device 200. In some embodiments, the window layer 170 can be positioned between the absorber layer 160 and the TCO layer 140. In one embodiment, the window layer 170 can be positioned between the absorber layer 160 and the buffer layer 150. The window layer 170 can include any suitable material, including, for example, cadmium sulfide, zinc sulfide, cadmium zinc sulfide, zinc magnesium oxide, or any combination thereof.

Referring again to FIGS. 1 and 3, the photovoltaic device 100, 200 can include a back contact 180 configured to mitigate undesired alteration of the dopant and to provide electrical contact to the absorber layer 160. The back contact 180 can have a first surface 182 substantially facing the energy side 102 of the photovoltaic device 100 and a second surface 184 substantially facing the opposing side 104 of the photovoltaic device 100. A thickness of the back contact 180 can be defined between the first surface 182 and the second surface 184. The thickness of the back contact 180 can be between about 5 nm to about 220 nm such as, for example, between about 10 nm to about 200 nm in one embodiment, or between about 10 nm to about 150 nm in one embodiment. The plurality of layers between and including the substrate 110 and the absorber layer 160 may be referred to as an absorber stack 109, 209. The back contact 180 may be disposed over the absorber stack 109, 209.

In some embodiments, the back contact 180 can be provided adjacent to the absorber layer 160. For example, the first surface 182 of the back contact 180 can be provided upon the second surface 164 of the absorber layer 160. In some embodiments, the back contact 180 can include binary or ternary combinations of materials from groups I, II, VI. For example, the back contact 180 can include one or more layers containing zinc, cadmium, tellurium, or a combination thereof. In some embodiments, one or more layers of the back contact can be doped with a dopant such as, for example, one or more Group I dopants. Alternatively or additionally, the back contact 180 can include one or more layers containing a metal nitride material such as, for example, $MoN_x$ (having an N composition x within the range of $0<x<1$), $TiN_y$ (having an N composition y within the range of $0<y<1.1$), $WN_z$ (having an N composition z within the range of $0<z<1.1$), $TaN_i$ (having an N composition i within the range of $0<i<1.1$), or $ZrN_j$ (having an N composition j within the range of $0<j<1.1$). Generally, the metal nitride materials are substantially oxygen free, i.e. the metal nitride materials include less than about 1% oxygen (at. %), such as, for example, less than about 0.5% oxygen. Alternatively or additionally, the back contact 180 can include one or more layers containing a metal oxynitride material such as, for example, titanium oxynitride, tungsten oxynitride, zirconium oxynitride, or tantalum oxynitride. In some embodiments, the titanium oxynitride can be defined as $TiO_aN_b$ (having an 0 composition a within the range of $0<a<1.0$ and an $N_2$ composition b within the range of $0<b<1.1$). In some embodiments, the tungsten oxynitride can be defined as $WO_cN_d$ (having an 0 composition c within the range of $0<c<1.0$ and an $N_2$ composition d within the range of $0<d<1.1$).

Figure 4:
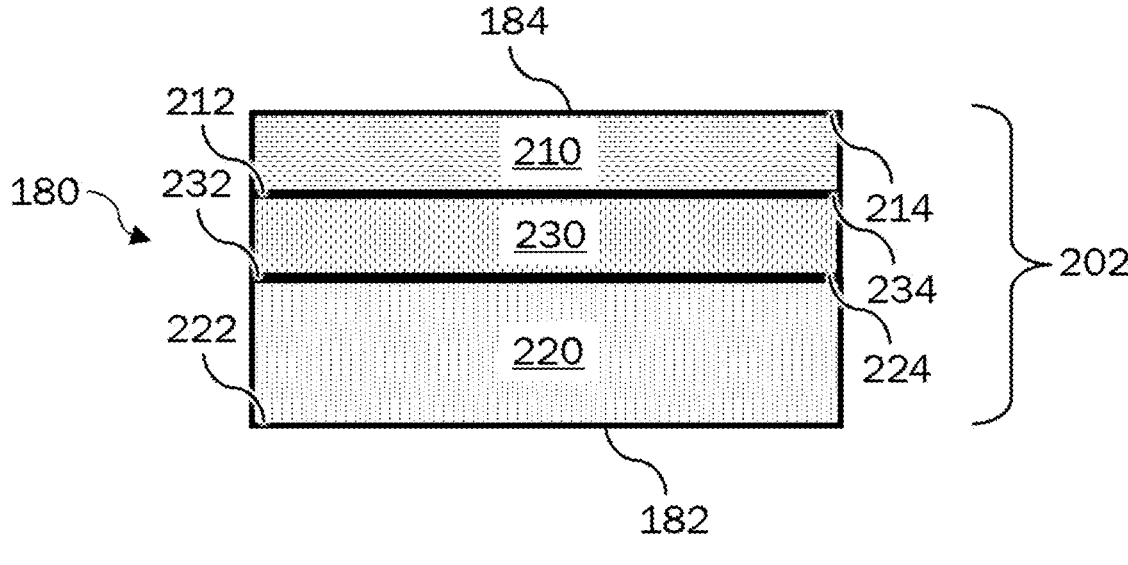
FIGS. 4-8 schematically depict back contacts according to one or more embodiments shown and described herein.

Referring collectively to FIGS. 1, 3, and 4, the back contact 180 can include a plurality of layers 202. The plurality of layers 202 of the back contact 180 can include a layer 210 including a metal oxynitride material. In some embodiments, the layer 210 can consist of the metal oxynitride material. In some embodiments, at least a portion of the metal oxynitride material can be composed of a group IV, a group V, or a group VI transition metal such as, for example, titanium or tungsten. The metal oxynitride material can be composed of less than about 70% of the transition metal (at. %) such as, for example, between about 25% to about 60% of the metal oxynitride material can be the transition metal in one embodiment, or between about 30% to about 50% of the metal oxynitride material can be the transition metal in another embodiment. The metal oxynitride material can be composed of less than about 50% of oxygen (at. %) such as, for example, between about 5% to about 40% of the metal oxynitride material can be oxygen in one embodiment, or between about 10% to about 25% of the metal oxynitride material can be oxygen in another embodiment. The metal oxynitride material can be composed of less than about 50% of nitrogen (at. %) such as, for example, between about 10% to about 45% of the metal oxynitride material can be nitrogen in one embodiment, or between about 25% to about 40% of the metal oxynitride material can be nitrogen in another embodiment.

The layer 210 can have a first surface 212 substantially facing the energy side 102 of the photovoltaic device 100, 200 and a second surface 214 substantially facing the opposing side 104 of the photovoltaic device 100, 200. In some embodiments, the second surface 214 of the layer 210 can be the second surface 184 of the back contact 180. A thickness of the layer 210 can be defined between the first surface 212 and the second surface 214. The thickness of the layer 210 including the metal oxynitride material can be between about between about 1 nm to about 20 nm such as, for example, between about 2 nm to about 20 nm in one embodiment, between about 3 nm to about 20 nm in another embodiment, between about 1 nm to about 5 nm in a further embodiment, or between about 5 nm to about 10 nm in a further embodiment.

The plurality of layers 202 of the back contact 180 can include one or more layers containing zinc, cadmium, tellurium, or a combination between the layer 210 including the metal oxynitride material and the first surface 182 of the back contact 180. For example, the plurality of layers 202 of the back contact 180 can include one or more layers containing zinc and tellurium between the layer 210 including the metal oxynitride material and the first surface 182 of the back contact 180. In some embodiments, the plurality of layers 202 of the back contact 180 can include a first layer 220 and a second layer 230 disposed between the layer 210 including the metal oxynitride material and the first surface 182 of the back contact 180. The first layer 220 of the back contact 180 can be disposed at the first surface 182 of the back contact 180. Accordingly, the first layer 220 can be provided adjacent to the absorber layer 160. In some embodiments, the first surface 182 of the back contact 180 can be the first surface 222 of the first layer 220. The first layer 220 can have a second surface 224 substantially facing the opposing side 104 of the photovoltaic device 100. The first layer 220 of the back contact 180 can include a ternary of cadmium, zinc, and tellurium. In some embodiments, the first layer 220 can consist of the ternary of cadmium, zinc, and tellurium.

The second layer 230 can be disposed between the layer 210 including the metal oxynitride material and the first layer 220 of the back contact 180. A thickness of the second layer 230 can be defined between a first surface 232 and a second surface 234. In some embodiments, the second layer 230 can be provided adjacent to the first layer 220 and the layer 210 including the metal oxynitride material. Accordingly, the first surface 232 of the second layer 230 can be in contact with the second surface 224 of the first layer 220, and the second surface 234 of the second layer 230 can be in contact with the first surface 212 of the layer 210. The first layer 230 of the back contact 180 can include a binary of zinc and tellurium, which can be doped with a dopant (e.g., copper, silver, or both). In some embodiments, the second layer 230 can consist of a doped binary of zinc and tellurium.

Figure 5:
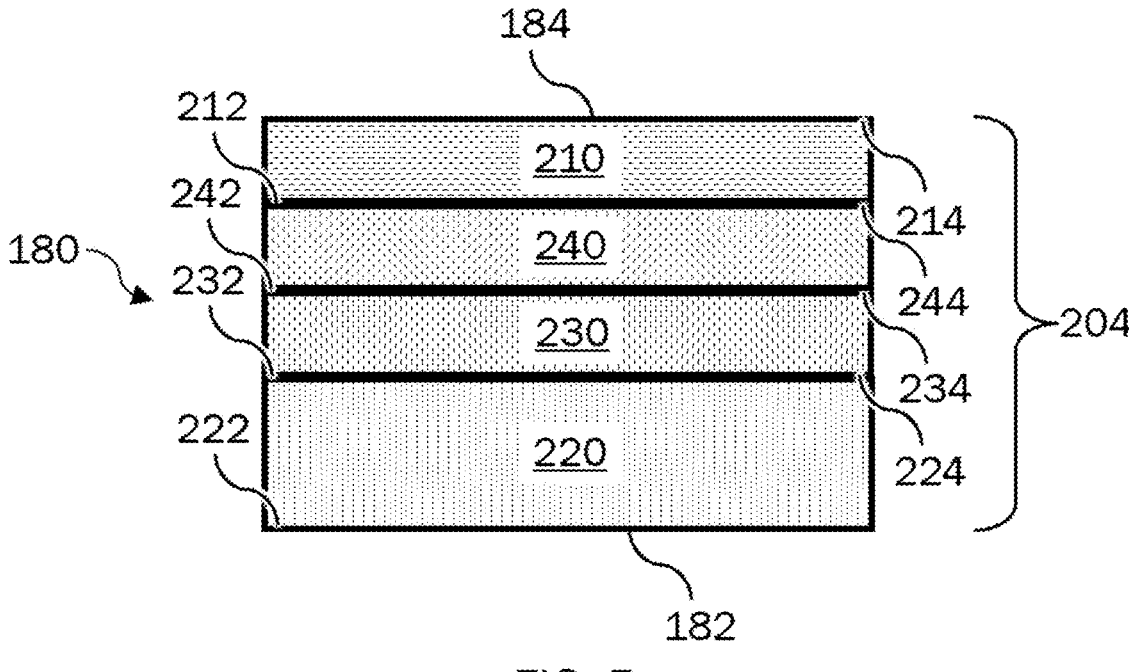

Referring collectively to FIGS. 1, 3, and 5, the back contact 180 can include a plurality of layers 204. The plurality of layers 204 of the back contact 180 can include a high purity metal layer 240 including a high concentration (at. %) of a group IV transition metal, a group V transition metal, or a group VI transition metal such as, for example, greater than about 80% of the high purity metal layer 240 can be composed of a selected transition metal in one embodiment, or greater than about 90% of the high purity metal layer 240 can be composed of a selected transition metal in one embodiment. In some embodiment, the high purity metal layer 240 can include a high concentration of titanium. In an example, the high-purity metal layer consists essentially of titanium. In an example, the high-purity metal layer consists essentially of titanium, tungsten, tantalum, zirconium, or combinations thereof.

The high purity metal layer 240 can have a first surface 242 substantially facing the energy side 102 of the photovoltaic device 100, 200 and a second surface 242 substantially facing the opposing side 104 of the photovoltaic device 100, 200. A thickness of the high purity metal layer 240 can be defined between the first surface 242 and the second surface 244. The thickness of the high purity metal layer 240 can be between about between about 1 nm to about 5 nm. Alternatively or additionally, the thickness of the high purity metal layer 240 can be less than the thickness of the layer 210 including the metal oxynitride material. In some embodiments, a ratio of the thickness of the thickness of the layer 210 including the metal oxynitride material to the thickness of the high purity metal layer 240 can be at least about 2:1.

The high purity metal layer 240 can be positioned closer to the first surface 182 of the back contact 180 than the layer 210 including the metal oxynitride material. In some embodiments, the high purity metal layer 240 can be disposed between the layer 210 including the metal oxynitride material and one or more layers containing zinc and tellurium. For example, the high purity metal layer 240 can be adjacent to the layer 210 including the metal oxynitride material. Accordingly, the second surface 244 of the high purity metal layer 240 can contact the first surface 212 of the layer 210 including the metal oxynitride material. Alternatively or additionally, the high purity metal layer 240 can be adjacent the second layer 230 of the back contact 180, i.e., the first surface 242 of high purity metal layer 240 can contact the second surface 234 of the second layer 230.

Figure 6:
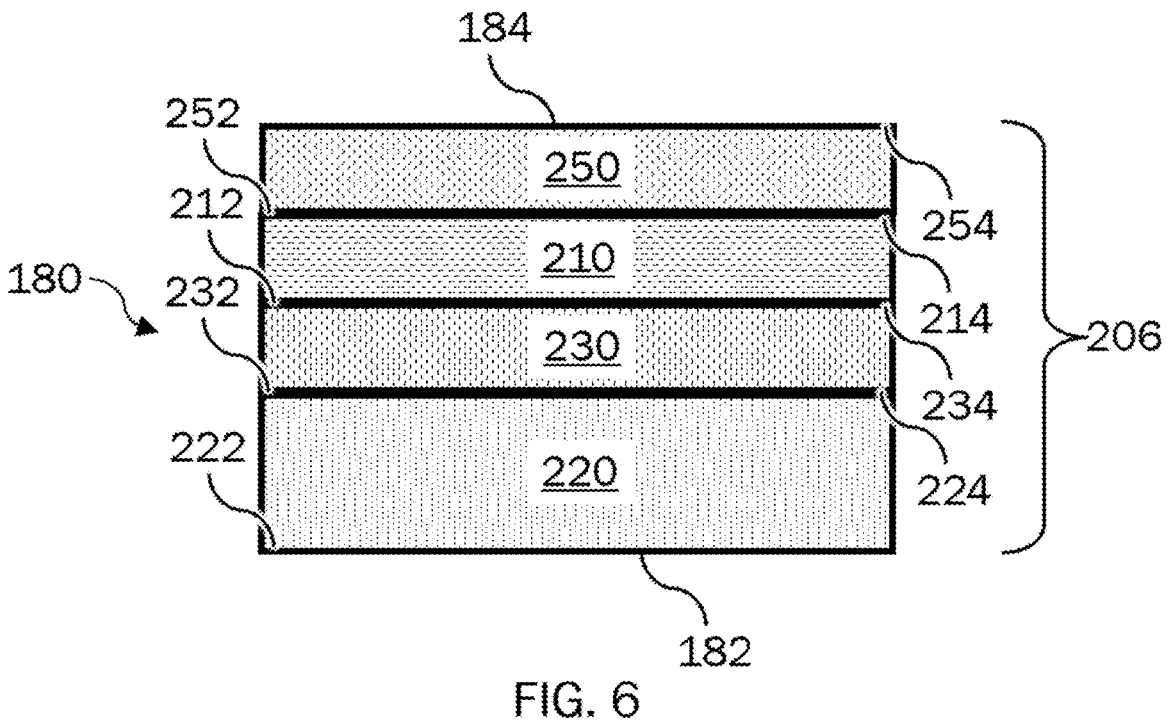

Referring collectively to FIGS. 1, 3, and 6, the back contact 180 can include a plurality of layers 206. The plurality of layers 206 of the back contact 180 can include a layer 250 including metal nitride material having a concentration (at. %) of metal that is between about 30% and about 70% and concentration of nitrogen (at. %) that is between about 70% and about 30%. Suitable metals include, but are not limited to, molybdenum, titanium, and tungsten. In some embodiments, the layer 250 can consist of metal nitride. The layer 250 including metal nitride can have a first surface 252 substantially facing the energy side 102 of the photovoltaic device 100, 200 and a second surface 254 substantially facing the opposing side 104 of the photovoltaic device 100, 200. A thickness of the layer 250 including metal nitride can be defined between the first surface 252 and the second surface 254. The thickness of the layer 250 including metal nitride can be between about between about 2 nm to about 20 nm. Alternatively or additionally, the thickness of the layer 250 including metal nitride can be greater than the thickness of the layer 210 including the metal oxynitride material. In some embodiments, a ratio of the thickness of the layer 250 including metal nitride to the thickness of the layer 210 including the metal oxynitride material can be at least about 2:1 such as, for example, at least about 3:1 in some embodiments.

The layer 250 including metal nitride can be positioned closer to the second surface 184 of the back contact 180 than the layer 210 including metal oxynitride material. In some embodiments, layer 250 including metal nitride can be adjacent to the layer 210 including metal oxynitride material. Accordingly, the second surface 214 of the layer 210 including metal oxynitride material can contact the first surface 252 of layer 250 including metal nitride. Alternatively or additionally, the second surface 254 of layer 250 including metal nitride can be the second surface 184 of the back contact 180.

Figure 7:
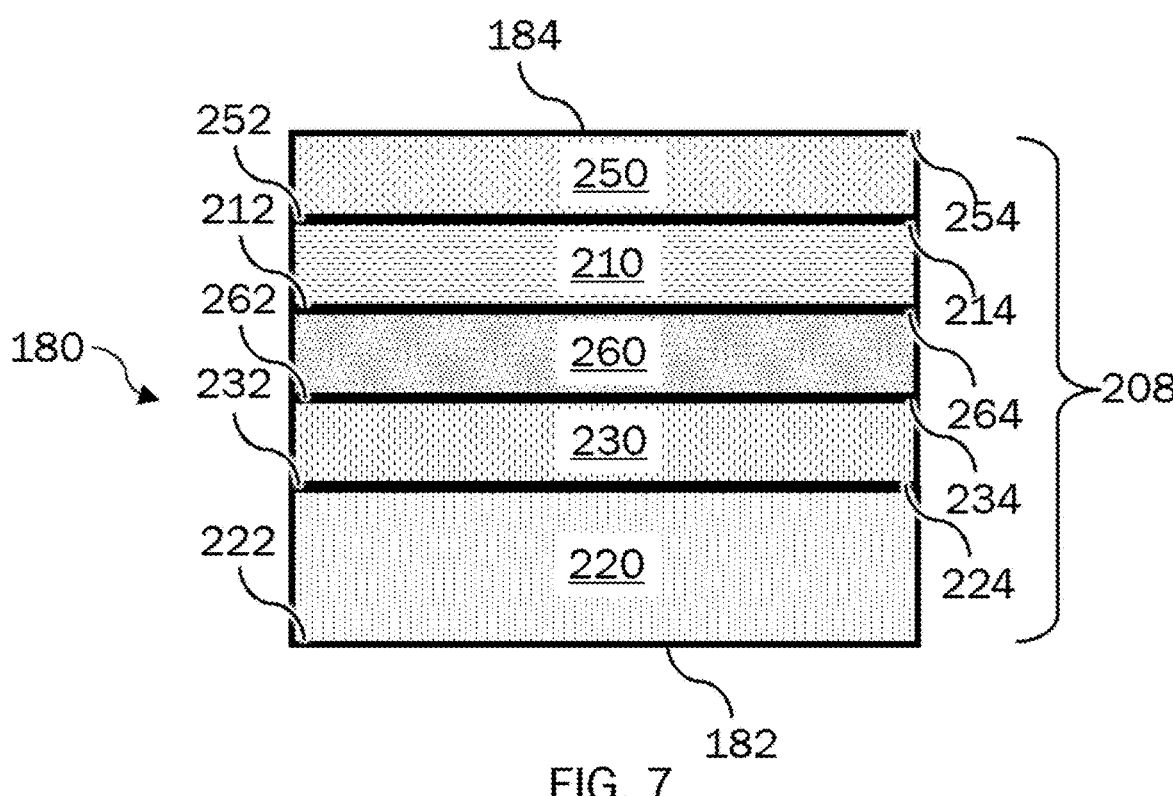

Referring collectively to FIGS. 1, 3, and 7, the back contact 180 can include a plurality of layers 208. The plurality of layers 208 of the back contact 180 can include a second layer 260 including metal oxynitride material. The second layer 260 including metal oxynitride material can be substantially similar to the layer 210 including metal oxynitride material. In some embodiments, the layer 210 including metal oxynitride material and the second layer 260 including metal oxynitride material can be formed from different metals. In some embodiments, the layer 210 can include $TiO_aN_b$ and the second layer 260 can include $WO_cN_d$. Alternatively, the layer 210 can include $WO_cN_d$ and the second layer 260 can include $TiO_aN_b$.

The second layer 260 including metal oxynitride material can be positioned closer to the first surface 182 of the back contact 180 than the layer 210 including metal oxynitride material. The second layer 260 including metal oxynitride material can have a first surface 262 substantially facing the energy side 102 of the photovoltaic device 100, 200 and a second surface 264 substantially facing the opposing side 104 of the photovoltaic device 100, 200. In some embodiments, the layer 260 including metal oxynitride can be adjacent to the layer 210 including metal oxynitride material. Accordingly, the second surface 264 of the second layer 260 including metal oxynitride material can contact the layer 210 including metal oxynitride material. Alternatively or additionally, second layer 260 including metal oxynitride material can be positioned between the layer 210 including metal oxynitride material and one or more layers containing zinc and tellurium. In some embodiments, the second layer 260 including metal oxynitride material can be adjacent to one or more layers containing zinc and tellurium. For example, the first surface 262 of the second layer 260 can contact the second surface 234 of the second layer 230 of the back contact 180.

Figure 8:
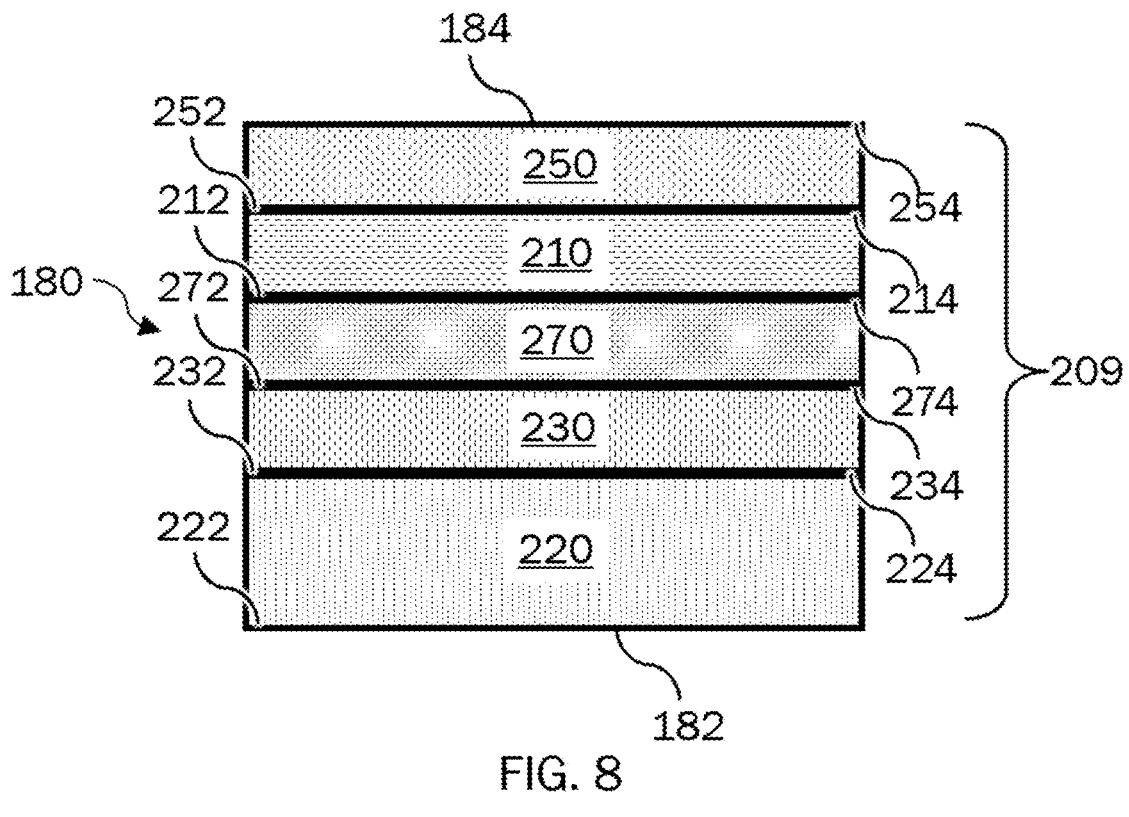

Referring collectively to FIGS. 1, 3, and 8, the back contact 180 can include a plurality of layers 209. The plurality of layers 209 of the back contact 180 can include a second layer 270 including metal nitride material. The second layer 270 including metal nitride material can have a first surface 272 substantially facing the energy side 102 of the photovoltaic device 100, 200 and a second surface 274 substantially facing the opposing side 104 of the photovoltaic device 100, 200. The second layer 270 including metal nitride material can be substantially similar to the layer 250 including metal nitride material. In some embodiments, the layer 250 including metal nitride material and the second layer 270 including metal nitride material can be formed from different metals. Alternatively, the layer 250 including metal nitride material and the second layer 270 including metal nitride material can be formed from the same material.

The second layer 270 including metal nitride material can be positioned closer to the first surface 182 of the back contact 180 than the layer 210 including metal oxynitride material. In some embodiments, the second layer 270 including metal nitride can be adjacent to the layer 210 including metal oxynitride material. Accordingly, the second surface 274 of the second layer 270 including metal nitride material can contact the first surface 212 of the layer 210 including metal oxynitride material. Alternatively or additionally, second layer 270 including metal nitride material can be positioned between the layer 210 including metal oxynitride material and one or more layers containing zinc and tellurium. In some embodiments, the second layer 270 including metal nitride material can be adjacent to one or more layers containing zinc and tellurium. For example, the first surface 272 of the second layer 270 can contact the second surface 234 of the second layer 230 of the back contact 180.

Figure 9:
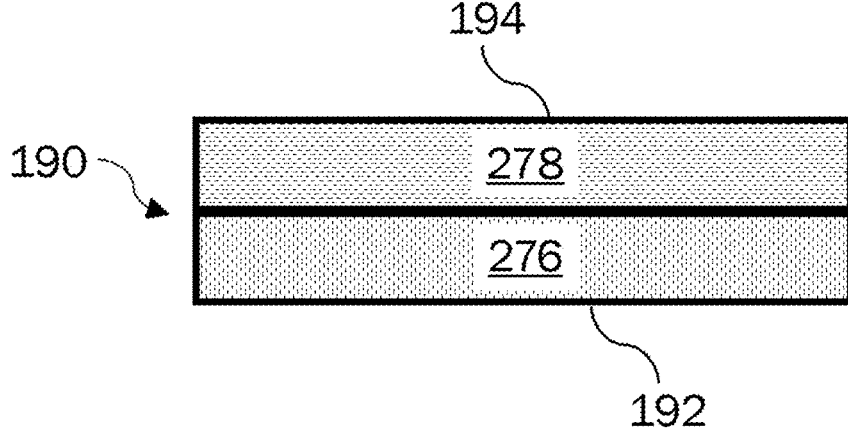
FIG. 9 schematically depicts a conducting layer according to one or more embodiments shown and described herein.

Referring collectively to FIGS. 1, 3, and 9, the photovoltaic device 100, 200 can include a conducting layer 190 configured to provide electrical contact with the absorber layer 160. The conducting layer 190 can have a first surface 192 substantially facing the energy side 102 of the photovoltaic device 100 and a second surface 194 substantially facing the opposing side 104 of the photovoltaic device 100. In some embodiments, the conducting layer 190 can be provided adjacent to the back contact 180. For example, the first surface 192 of the conducting layer 190 can be provided upon the second surface 184 of the back contact 180. The conducting layer 190 can include any suitable conducting material such as, for example, one or more layers of silver, nickel, copper, aluminum, titanium, palladium, chromium, molybdenum, gold, or alloys thereof. In some embodiments, the first surface 192 of the conducting layer 190 can be formed by a layer 276 including aluminum such as, for example a layer including at least about 90% aluminum (at. %) (e.g., at least about 95% aluminum). Alternatively or additionally, the second surface 194 of the conducting layer 190 can be formed by a layer 278 including chromium.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed over the conducting layer 190. The back support 196 can include any suitable material, including, for example, glass (e.g., soda-lime glass).

The layers of the photovoltaic device 100, 200 and the devices described herein may be formed by manufacturing processes. The layers may be formed by one or more deposition processes, including, but not limited to, sputtering, vapor transport deposition (VTD), pulse laser deposition (PLD), chemical vapor deposition (CVD), electrochemical deposition (ECD), evaporation, and/or atomic layer deposition (ALD).

A method of manufacturing a photovoltaic structure can include sequentially forming layers on a substrate. A TCO layer can be formed on a substrate layer, such as glass. Optionally, a buffer layer, a window layer, and/or an interfacial layer, can be deposited over the substrate, including over the previously applied TCO layer. An absorber layer can be deposited over the substrate including the optional interfacial layer, the optional n-type window layer, the optional buffer layer, the TCO layer, and the substrate. The plurality of layers between and including the substrate and the absorber layer may be referred to as an absorber stack. The absorber stack may be treated, for example by heating, activation, and/or passivation, before a back contact layer is applied. One or more layers are deposited to form a back contact layer over the absorber stack. One or more layers are deposited to form a conducting layer over the back contact layer. A back support can be formed over the conducting layer. Scribe lines may be formed through selected layers during the manufacturing process.

Precursor layers and treatments can be applied to introduce dopants and/or achieve specific final layer composition and structure. Layer deposition may include the deposition of one or more precursor layers that require an annealing step or heating step after the deposition thereof to form the layer. As an example, in an embodiment where the absorber layer is formed from one or more precursor layers, a first precursor layer, for example, cadmium selenide (CdSe), is deposited over a substrate structure followed by the deposition of a second precursor layer, for example, cadmium telluride (CdTe), over the first precursor layer. The deposited precursor layers are then annealed to form desired final layer composition, for example, a cadmium selenium telluride alloy (CdSeTe). The annealing step(s) causes interdiffusion of Se through the CdSeTe layer.

An activation process may be performed on the deposited layers. As an example, an absorber activation step can be used to form an activated p-type absorber layer. The absorber activation step can include the introduction of a material containing chlorine to the semiconductor material layers, for example cadmium chloride (CdCl$_2$) as a bathing solution, spray, or vapor, and an associated annealing of the absorber stack at an elevated temperature. For example, if CdCl$_2$ is used, the CdCl$_2$ can be applied over the absorber layer as an aqueous solution. Alternatively, the absorber layer can be annealed with CdCl$_2$ by continuously flowing CdCl$_2$ vapor over the surface of the absorber layer during the annealing step. Alternative chlorine-doping materials can also be used such as MnCl$_2$, MgCl$_2$, NH$_4$Cl, ZnCl$_2$, or TeCl$_4$. An example anneal can be performed at a temperature of about 350° C.-475° C. for a total duration of 90 minutes or less, with a soaking time equal to or less than 60 minutes.

A multi-step activation step may be used. With each desired activation mechanism in the multi-step activation step, such as semiconductor grain growth, chlorine diffusion, sulfur and/or selenium inter-diffusion into the layers, a different thermal activation energy may be used to achieve desired layer characteristics.

In an example, an absorber activation step is followed by a cleaning and passivation step, which is followed by sequential deposition of a plurality of layers forming a back contact.

Figure 10:
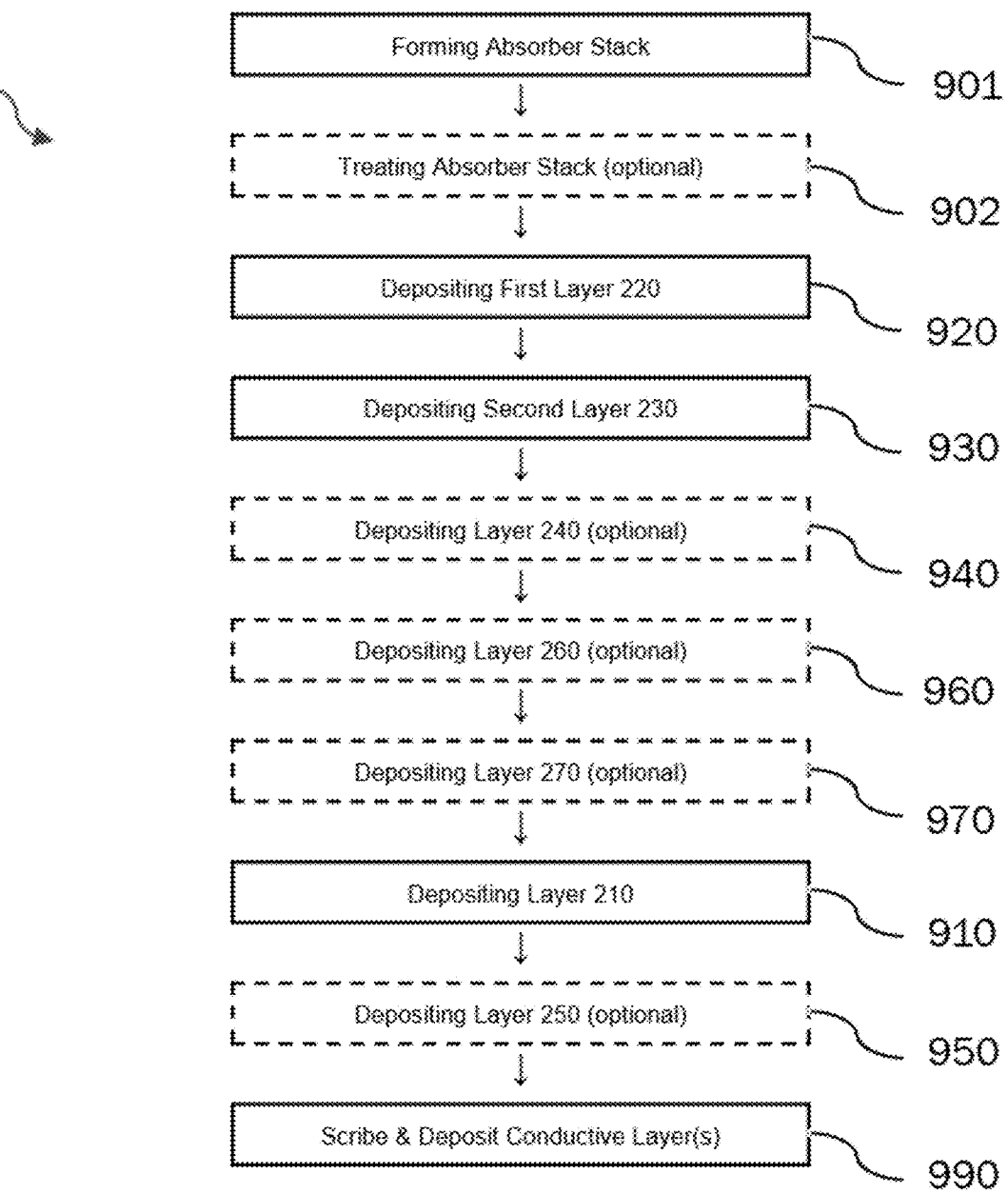
FIG. 10 depicts a flow chart for forming back contacts according to one or more embodiments shown and described herein.

Turning now to FIG. 10, with reference to FIGS. 4-8, an example method 900 for forming a back contact 180 is depicted. An absorber stack is provided 901. Optionally, the absorber stack may be passivated 902. The plurality of layers (202, 204, 206, 208) forming the back contact 180 are deposited. In the example method for forming a back contact, the first layer 220 is deposited 220 over the absorber stack 109, 209. The second layer 230 is deposited over the first layer 220. Optionally, one or more selected layers 240, 260, 270, are deposited 940, 960, 970, over the second layer. The selected layers may include one or more of: a high-purity metal layer, a second metal oxynitride layer, or a second metal nitride layer. A material is deposited 910 to form layer 210, comprising a first metal oxynitride. Optionally, a layer 250, comprising a metal nitride, is deposited over the layer 210. The second surface 184 of the back contact 180 corresponds to either the second surface 254 of layer 250, if optional layer 250 is present, or to the second surface 214 of layer 210, comprising a metal oxynitride, if layer 250 and step 950 are omitted. The layer stack including the plurality of layers comprising the back contact may optionally be heat treated. Scribes may be applied. One or more layers of conductive material are deposited 990 over the second surface 184 of the back contact 180 to form the conductive layer 190.

Figure 11:
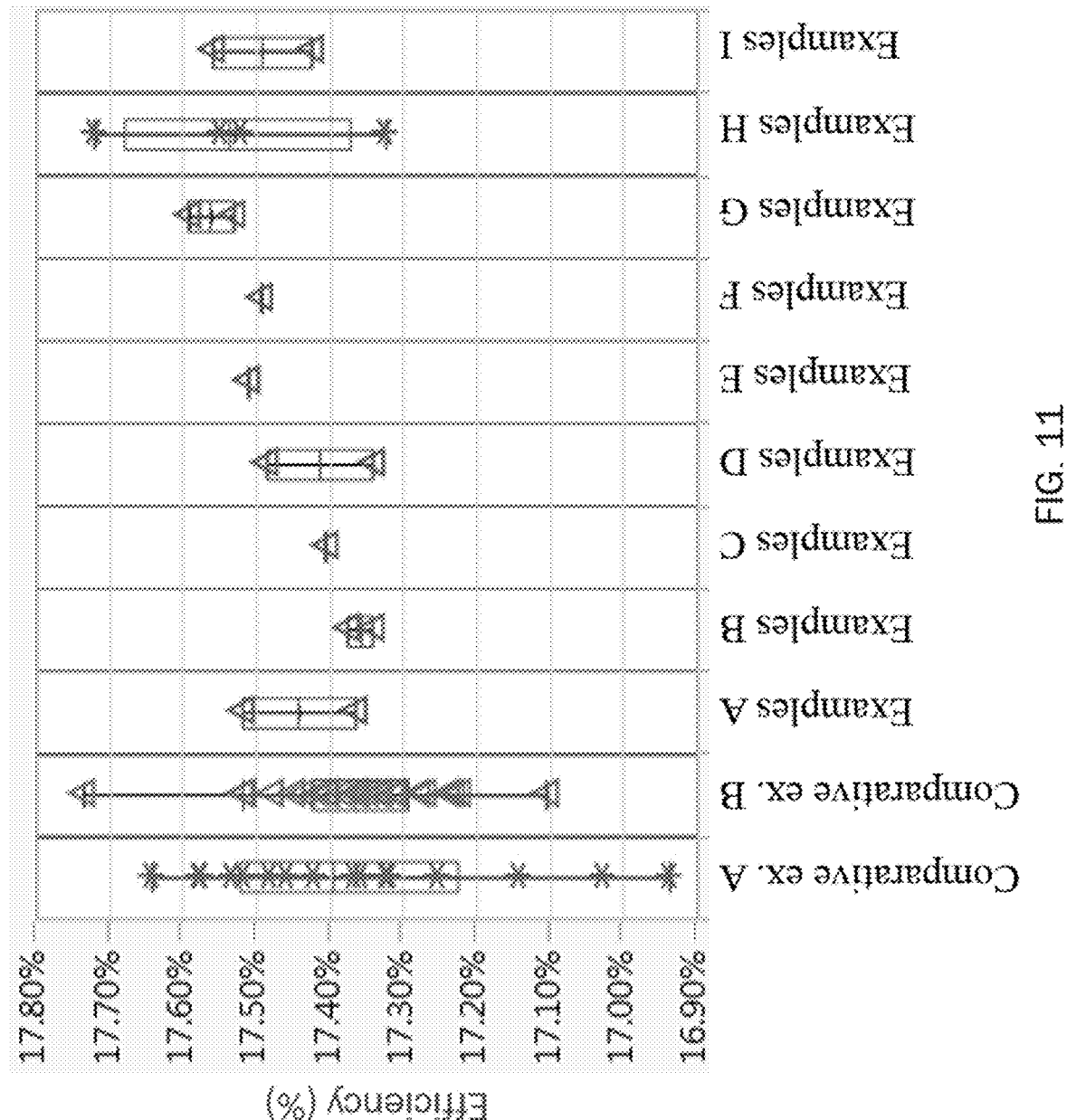
FIG. 11 shows results of testing comparative examples relative to devices according to one or more embodiments shown and described herein.
Figure 12:
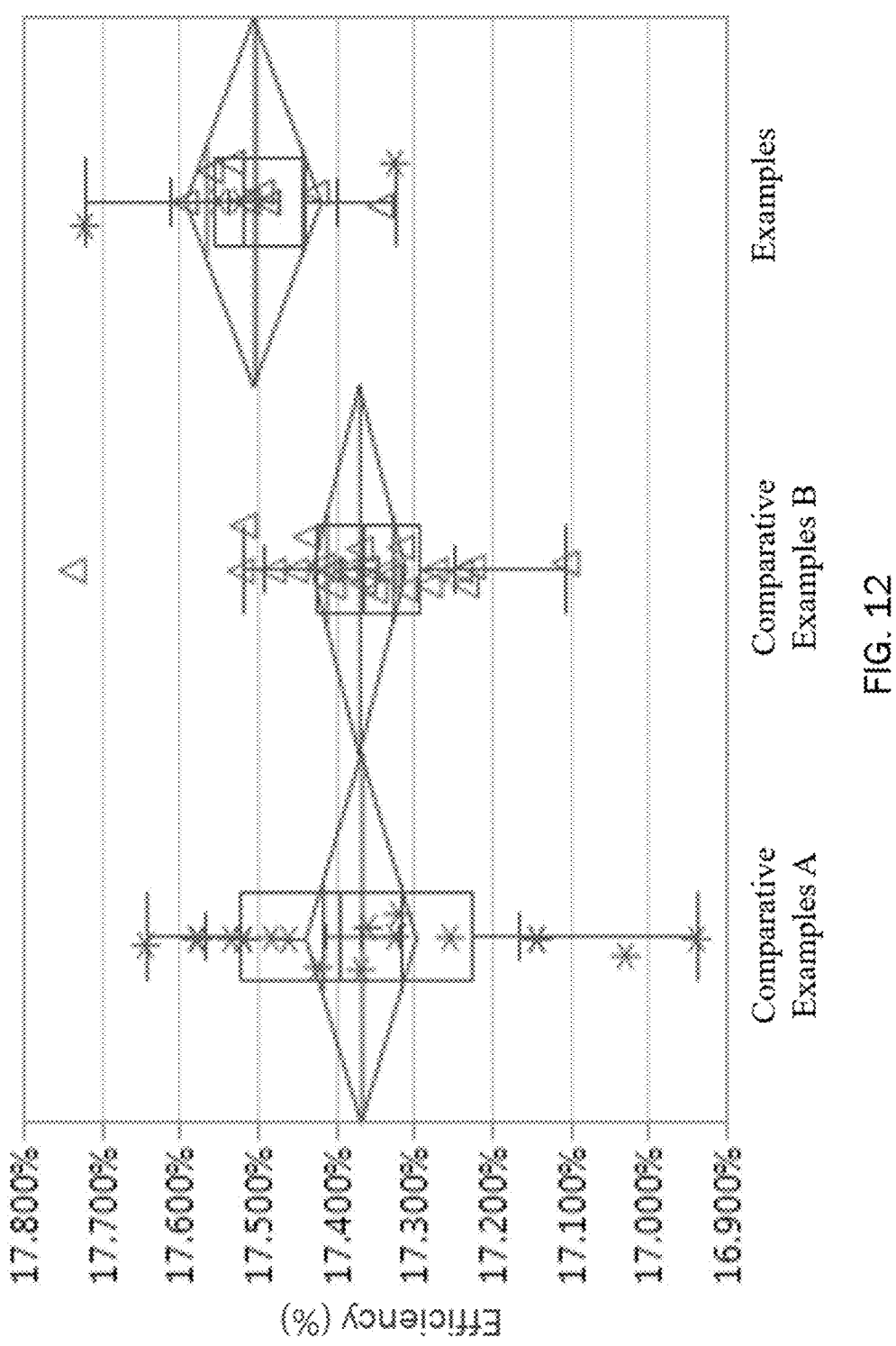
FIG. 12 shows results of testing comparative examples relative to devices according to one or more embodiments shown and described herein.

FIGS. 11-12 show results of testing example devices relative to comparative examples. In an example process, a DC magnetron reactive sputtering process has been employed to form metal nitride layers. The process pressure varies from 2 to 15 mTorr, temperature ranges from room temperature to as high as 200 C, $N_2$% from as low as 14 to 70%, process flow rates varying from 200 to 1000 sccm for $N_2$, gas mixtures predominantly Ar+$N_2$ (metal nitrides) or Ar+$O_2$+$N_2$ (metal oxy-nitrides). Conductive layers of Al and Cr are deposited using DC magnetron sputtering with Ar only.

FIG. 11 shows efficiency increasing along the y-axis and shows eleven columns along the x-axis with each column corresponding to a set of devices. The two columns on the left are the comparative examples. Two sets of comparative examples are shown, comparative example A and comparative example B. The comparative examples have a back contact comprising a ZnTe:Cu/MoN$_x$ back contact. The nine columns to the right of the comparative examples show sets of devices according to embodiments of the invention with different columns comparing thickness and nitrogen content of a metal nitride layer. In these example devices, there is no MoN$_x$ layer. Example devices were prepared with a titanium nitride layer thickness of 40, 60, 70 or 80 angstroms (4.0, 6.0, 7.0, or 8.0 nm). The comparative examples included a MoN$_x$ layer having a thickness of 50 angstroms (5.0 nm) and no TiN$_x$ layer. Example devices were prepared at selected points within a range of $N_2$% from 33% to 50%. The comparative examples were prepared within a range of $N_2$% from 33% to 50%. Example devices and comparative examples were prepared under similar deposition conditions, including conditions of temperature and pressure.

FIG. 12 shows efficiency increasing along the y-axis and shows groupings of devices along the x-axis. The comparative examples are the middle and left sets and the example device is shown in the grouping on the right. As shown, the example devices demonstrated greater efficiency than the comparative devices.

In embodiments of the invention, a back contact includes a plurality of layers. In an example, the plurality of layers includes: a CdZnTe layer comprising an alloy of cadmium, tellurium, and zinc, and optionally comprising a dopant, such as copper and/or silver, the CdZnTe layer disposed adjacent to the absorber stack; a ZnTe layer disposed adjacent to the CdZnTe layer and comprising zinc telluride doped with copper and/or silver; a metal oxynitride layer comprising at least one transition metal selected from the group consisting of titanium (Ti), tungsten (W), tantalum (Ta), or zirconium (Zr), the metal oxynitride layer disposed adjacent to the ZnTe layer; and a metal nitride layer comprising at least one transition metal selected from the group consisting of: titanium (Ti), tungsten (W), tantalum (Ta), or zirconium (Zr), disposed adjacent to the metal oxynitride layer. A conducting layer may be disposed over the back contact and adjacent to the metal nitride layer. In an example device, the metal nitride comprises titanium nitride and the oxynitride comprises titanium oxynitride.

In embodiments of the invention, a back contact includes a plurality of layers. In an example, the plurality of layers includes: a CdZnTe layer comprising an alloy of cadmium, tellurium, and zinc, optionally doped with copper and/or silver, disposed adjacent to the absorber stack; a ZnTe layer disposed adjacent to the CdZnTe layer and comprising zinc telluride, optionally doped with copper and/or silver; a high-purity metal layer comprising at least one transition metal selected from the group consisting of titanium (Ti), tungsten (W), tantalum (Ta), or zirconium (Zr), the high-purity metal layer disposed adjacent the ZnTe layer; a back layer comprising a metal oxynitride layer and/or a metal nitride layer, the back layer comprising at least one transition metal of the group consisting of: titanium (Ti), tungsten (W), tantalum (Ta), zirconium (Zr), or molybdenum (Mo), the back layer disposed adjacent to the high-purity metal layer; and a conducting layer disposed adjacent to the back layer. In an example device, the high-purity metal layer comprises titanium and the back layer comprises molybdenum and/or titanium.

In embodiments of the invention, a back contact includes a plurality of layers. In an example, the plurality of layers includes: at least one front layer comprising an alloy of tellurium and zinc, optionally alloyed with cadmium, and optionally doped with copper and/or silver, the at least one front layer disposed adjacent to the absorber stack; a high-purity metal layer comprising at least one transition metal selected from the group consisting of titanium (Ti), tungsten (W), tantalum (Ta), or zirconium (Zr), the high-purity metal layer disposed over the at least one front layer; a back layer comprising a metal oxynitride layer and/or a metal nitride layer, the back layer comprising at least one transition metal of the group consisting of: titanium (Ti), tungsten (W), tantalum (Ta), zirconium (Zr), or molybdenum (Mo), the back layer disposed over the high-purity metal layer; and a conducting layer disposed adjacent to the back layer. In an example device, the high-purity metal layer comprises titanium and the back layer comprises molybdenum and/or titanium.

In embodiments of the invention, a back contact includes a plurality of layers. In an example, the plurality of layers includes: a CdZnTe layer comprising an alloy of cadmium, tellurium, and zinc, optionally doped with copper and/or silver, disposed over the absorber stack; a ZnTe layer disposed over the CdZnTe layer and comprising zinc telluride, optionally doped with copper and/or silver; a metal oxynitride layer comprising at least one transition metal selected from the group consisting of titanium (Ti), tungsten (W), tantalum (Ta), zirconium (Zr), and/or chromium (Cr), the metal oxynitride layer disposed over the ZnTe layer; a metal nitride layer comprising at least one transition metal selected from the group consisting of: titanium (Ti), tungsten (W), tantalum (Ta), zirconium (Zr), and/or chromium (Cr), disposed adjacent to the metal oxynitride layer; and a second metal nitride layer comprising at least one transition metal selected from the group consisting of: titanium (Ti), tungsten (W), tantalum (Ta), zirconium (Zr), and/or molybdenum (Mo), disposed between and adjacent to the metal oxynitride layer and the ZnTe layer. A conducting layer may be disposed over the metal nitride layer of the back contact. In an example, the conducting layer may include a plurality of layers comprising aluminum and chromium. In an example device, the metal nitride comprises titanium nitride, the second metal nitride comprises titanium nitride, and the oxynitride comprises titanium oxynitride.

In embodiments of the invention, a back contact includes a plurality of layers. In an example, the plurality of layers includes: at least one front layer comprising an alloy of tellurium and zinc, optionally alloyed with cadmium, and optionally doped with copper and/or silver, the at least one front layer disposed over the absorber stack, including an absorber layer having cadmium, tellurium, and selenium; and a back layer comprising a metal oxynitride layer and/or a metal nitride layer, the back layer comprising at least one transition metal of the group consisting of: titanium (Ti), tungsten (W), tantalum (Ta), or zirconium (Zr), the back layer disposed over the at least one front layer. A conducting layer may be disposed over the back layer of the back contact. In an example device, the back layer comprises titanium nitride and/or titanium oxynitride and the device includes no molybdenum.

In an example method, at least one layer of the back contact is deposited by vapor transport deposition (VTD) onto a substrate stack conveyed along a deposition path. Precursor materials are heated to form a vapor directed to the substrate by a carrier gas.

In an example method, the back contact is formed by VTD steps and by sputtering. In an embodiment, alloys of cadmium, tellurium, and zinc, are deposited by VTD, and layers of nitrides and/or oxynitrides are deposited by reactive magnetron sputtering.

In an example, the metal of the metal nitride material includes molybdenum, titanium, tungsten, tantalum, and/or zirconium.

In an example, the metal of the metal nitride material includes at least one of: titanium, tungsten, tantalum, or zirconium.

In embodiments of the invention, an absorber stack includes a p-type absorber layer comprising cadmium and tellurium.

In an example, an absorber stack includes a p-type absorber layer comprising cadmium, tellurium, and selenium.

In an example, a back contact is between, and adjacent to, the absorber stack and a conducting layer.

In an example, a conducting layer comprises: at least one layer comprising aluminum adjacent to at least one layer comprising chromium.

In an example, the metal oxynitride material comprises 30% to 70% of a group IV transition metal, a group V transition metal, or a group VI transition metal, and the metal oxynitride material comprises 1% to 15% oxygen.

In an example, the metal oxynitride material comprises: 30% to 50% nitrogen, 2% to 8% oxygen, and 42% to 68% of at least one metal selected from the group consisting of titanium (Ti), tungsten (W), tantalum (Ta), zirconium (Zr).

In an example, the photovoltaic device includes no molybdenum (Mo).

In an example, a metal oxynitride layer consists essentially of titanium oxynitride. In some embodiments, a layer comprising a titanium oxynitride material includes less than 25% oxygen. In some embodiments, a layer comprising a titanium oxynitride material includes between 2% to 15% oxygen. In some embodiments, a layer comprising a titanium oxynitride material has a thickness in a range of 0.5 nm to 5.0 nm.

In an example, a metal oxynitride layer consists essentially of tungsten oxynitride. In some embodiments, a layer comprising a tungsten oxynitride material includes less than 25% oxygen. In some embodiments, a layer comprising a tungsten oxynitride material includes between 1% to 20% oxygen. In some embodiments, a layer comprising a tungsten oxynitride material has a thickness in a range of 0.5 nm to 5.0 nm.

In an example, a metal oxynitride layer consists essentially of tantalum oxynitride.

In an example, a metal oxynitride layer consists essentially of zirconium oxynitride.

In an example, a back contact comprises a first metal oxynitride layer adjacent to a second metal oxynitride layer; the first metal oxynitride layer comprises tungsten, and the second metal oxynitride layer comprises titanium.

In an example, a metal oxynitride layer comprises 1% to 50% oxygen.

In an example, a metal oxynitride material comprises less than 50% nitrogen.

In an example, the back contact includes a high-purity metal layer. In some embodiments, the high-purity metal layer has a thickness between 1 nm and 5 nm. In some embodiments, the high-purity metal layer comprises a composition of 85% to 100% or 95% to 100% of a single metal element. In some embodiments, the high-purity metal layer comprises a composition of 85% to 100% or 95% to 100% of an alloy of metal elements. In some embodiments, the high-purity metal layer consists essentially of titanium.

In an example, the layer comprising the metal oxynitride material has a thickness between 1 nm and 20 nm and the thickness of the back contact is between 5 nm and 220 nm.

In another aspect, a photovoltaic device comprises: an absorber stack; a conducting layer having a surface formed by a layer comprising aluminum; and a back contact having a first surface, a second surface, and a thickness defined between the first surface of the back contact and the second surface of the back contact, wherein: the first surface of the back contact is adjacent to a p-type absorber layer of the absorber stack; the second surface of the back contact is in contact with the surface of the conducting layer; and the back contact comprises a layer comprising a metal oxynitride material and one or more layers containing zinc, cadmium, tellurium, or any combination thereof positioned between the layer comprising the metal oxynitride material and the first surface of the back contact.

In some embodiments, the metal oxynitride material comprises a group IV transition metal, a group V transition metal, or a group VI transition metal.

In some embodiments, the metal nitride material and/or the metal oxynitride material comprises a group IV transition metal, a group V transition metal, or a group VI transition metal that excludes molybdenum.

In some embodiments, the metal oxynitride material comprises less than about 70% of the group IV transition metal, the group V transition metal, or the group VI transition metal.

In some embodiments, the metal oxynitride material is titanium oxynitride.

In some embodiments, the metal oxynitride material is tungsten oxynitride.

In some embodiments, the metal oxynitride material is tantalum oxynitride.

In some embodiments, the metal oxynitride material is zirconium oxynitride.

In some embodiments, the metal oxynitride material comprises less than 50% oxygen.

In some embodiments, the metal oxynitride material comprises less than 50% nitrogen.

In some embodiments, the layer comprising the metal oxynitride material has a thickness between 1 nm and 20 nm.

In some embodiments, the thickness of the back contact is between 5 nm and 220 nm.

In some embodiments, the one or more layers containing zinc, cadmium, tellurium, or any combination thereof, comprises a first layer comprising a ternary of cadmium, zinc, and tellurium, and a second layer comprising a binary of zinc and tellurium; and the first layer of the one or more layers containing zinc, cadmium, tellurium, or any combination thereof is positioned closer to the first surface of the back contact than the second layer of the one or more layers containing zinc, cadmium, tellurium, or any combination thereof.

In an example, the binary of zinc and tellurium is doped with copper, silver, or both.

In some embodiments, the back contact comprises a high purity metal layer disposed between the layer comprising the metal oxynitride material and the one or more layers containing zinc, cadmium, tellurium, or any combination thereof; and the high purity metal layer comprises at least 80% of a metal.

In an example, the metal of the high purity metal layer is titanium.

In some embodiments, a thickness of the high purity metal layer is less than a thickness of the layer comprising the metal oxynitride material.

In some embodiments, the back contact comprises a layer comprising a metal nitride material; the layer comprising the metal nitride material is positioned closer to the second surface of the back contact than the layer comprising the metal oxynitride material; and the metal nitride material has a concentration of metal that is between 30% and 70% and a concentration of nitrogen that is between 70% and 30%.

In some embodiments, the metal of the metal nitride material is molybdenum, titanium, tungsten, tantalum, or zirconium.

In some embodiments, a ratio of a thickness of the layer comprising the metal nitride material to a thickness of the layer comprising the metal oxynitride material is at least 2:1.

In some embodiments, the second surface of the back contact is formed by the layer comprising the metal nitride material.

In some embodiments, the back contact comprises a second layer comprising a metal nitride material; and the second layer comprising a metal nitride material is adjacent to the layer comprising the metal oxynitride material.

In some embodiments, the back contact comprises a second layer comprising a metal oxynitride material; the second layer comprising the metal oxynitride material is positioned between the layer comprising the metal oxynitride material and the one or more layers containing zinc, cadmium, tellurium, or any combination thereof.

In some embodiments, the layer comprising the metal oxynitride material and the second layer comprising the metal oxynitride material are formed from different metal oxynitrides.

In some embodiments, the conducting layer has a second surface formed by a layer comprising chromium.

In some embodiments, the photovoltaic device comprises an absorber layer comprising cadmium and tellurium, wherein the first surface of the back contact is adjacent to the absorber layer.

In another aspect, a photovoltaic device comprises: an absorber layer comprising cadmium and tellurium; and a back contact having a first surface, a second surface, and a thickness defined between the first surface of the back contact and the second surface of the back contact, wherein: the first surface of the back contact is in contact with the absorber layer; and the back contact comprises a layer comprising a metal oxynitride material and one or more layers containing zinc, cadmium, tellurium, or any combination thereof positioned between the layer comprising a metal oxynitride material and the first surface of the back contact.

In some embodiments, the photovoltaic device comprises a conducting layer having a surface formed by a layer comprising aluminum, wherein the second surface of the back contact is in contact with the surface of the conducting layer.

It should now be understood that embodiments of the present disclosure provide back contacts including one or more layers of metal oxynitride. The back contacts provided herein exhibit low electric resistivity for high ohmic contact, high work function, and thermal stability. Accordingly, the back contacts described herein can form a low barrier contact for absorber films including CdTe. The back contacts including one or more layers of metal oxynitride, as provided herein, were included in photovoltaic devices that demonstrated improved solar electric conversion efficiency compared to substantially similar photovoltaic devices that omitted the one or more layers of metal oxynitride from their back contact. The higher efficiency was correlated with improved photovoltaic device parameters (e.g., higher short circuit current, higher fill factor, higher open circuit voltage, lower open circuit resistance).

According to the embodiments provided herein, a photovoltaic device can include a conducting layer and a back contact. The conducting layer can have a surface formed by a layer comprising aluminum. The back contact can have a first surface, a second surface, and a thickness defined between the first surface of the back contact and the second surface of the back contact. The second surface of the back contact can be in contact with the surface of the conducting layer. The back contact can include a layer including a metal oxynitride material and one or more layers including zinc, cadmium, tellurium, or any combination thereof. The one or more layers including zinc, cadmium, tellurium, or any combination thereof can be positioned between the layer including the metal oxynitride material and the first surface of the back contact.

According to the embodiments provided herein, a photovoltaic device can include an absorber layer and a back contact. The absorber layer can include cadmium and tellurium. The back contact can have a first surface, a second surface, and a thickness defined between the first surface of the back contact and the second surface of the back contact. The first surface of the back contact can be in contact with the absorber layer. The back contact can include a layer including a metal oxynitride material and one or more layers including zinc, cadmium, tellurium, or any combination thereof. The one or more layers including zinc, cadmium, tellurium, or any combination thereof can be positioned between the layer including the metal oxynitride material and the first surface of the back contact.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device comprising:
   a substrate;
   a front contact over the substrate;
   an absorber layer over the front contact;
   a conducting layer having a surface formed by a layer comprising aluminum; and
   a back contact between the absorber layer and the conducting layer, the back contact having a first surface, a second surface, and a thickness defined between the first surface of the back contact and the second surface of the back contact, wherein:
      the thickness of the back contact is in a range of about 10 nm to about 150 nm;

the first surface of the back contact is in contact with the absorber layer;
      the second surface of the back contact is in contact with the surface of the conducting layer;
      the back contact comprises: a first layer comprising zinc and tellurium; a second layer comprising zinc and tellurium; and a layer comprising a metal oxynitride material; wherein:
         the metal of the metal oxynitride material is at least one of titanium or tungsten;
         the first layer comprises a first dopant; and
         the second layer comprises a second dopant.

2. The photovoltaic device of claim 1, wherein the metal oxynitride material is composed of about 50% or less oxygen or nitrogen.

3. The photovoltaic device of claim 1, wherein:
   the first dopant includes a copper dopant, a silver dopant or both; and
   the second dopant is a group I dopant.

4. The photovoltaic device of claim 1, further comprising a high purity metal layer, wherein:
   the high-purity metal layer consists essentially of: titanium, tungsten, tantalum, zirconium, or combinations thereof;
   the high-purity metal layer has a thickness between about 1 nm to about 5 nm; and
   the high purity metal layer is between the layer comprising the metal oxynitride material and the second layer of the back contact.

5. The photovoltaic device of claim 4, wherein the metal oxynitride material includes a thickness in a ratio of at least about 2:1 in comparison to the high purity metal layer.

6. The photovoltaic device of claim 1, wherein the absorber layer includes a group I dopant, a group V dopant or a combination thereof.

* * * * *